United States Patent
Choi et al.

(10) Patent No.: US 8,365,030 B1
(45) Date of Patent: Jan. 29, 2013

(54) NONVOLATILE MEMORY DEVICES AND ERROR CORRECTION METHODS THEREOF

(75) Inventors: JinHyeok Choi, Yongin-si (KR); Hwaseok Oh, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 358 days.

(21) Appl. No.: 12/662,016

(22) Filed: Mar. 29, 2010

Related U.S. Application Data

(60) Provisional application No. 61/202,710, filed on Mar. 30, 2009.

(51) Int. Cl.
*G06F 11/00* (2006.01)
(52) U.S. Cl. .................................. 714/746; 714/799
(58) Field of Classification Search .................. 714/746, 714/745, 747, 798, 799, 761, 762, 764, 766
See application file for complete search history.

(56) References Cited

U.S. PATENT DOCUMENTS

| | | | |
|---|---|---|---|
| 6,418,058 B1 * | 7/2002 | Sakui et al. | ............... 365/185.22 |
| 7,447,079 B2 | 11/2008 | Nguyen et al. | |
| 2008/0181001 A1 | 7/2008 | Shalvi | |
| 2008/0247238 A1 * | 10/2008 | Nguyen et al. | ........... 365/185.21 |
| 2008/0298127 A1 | 12/2008 | Kim et al. | |

FOREIGN PATENT DOCUMENTS

| | | |
|---|---|---|
| JP | 2001-052487 | 2/2001 |
| KR | 10-2001-0030062 | 4/2001 |
| KR | 10-2008-0103362 | 11/2008 |
| KR | 10-2008-0105753 | 12/2008 |

OTHER PUBLICATIONS

Abstract of KR 10-0366741 published on Dec. 17, 2002.

* cited by examiner

*Primary Examiner* — Dieu-Minh Le
(74) *Attorney, Agent, or Firm* — Harness, Dickey & Pierce, P.L.C.

(57) ABSTRACT

A method for correcting read data error of a nonvolatile memory device, the error correction method including performing a first read operation of applying a first non-selection read voltage to a plurality of unselected memory cells to read a plurality of selected memory cells, performing a second read operation of applying a second non-selection read voltage less than the first non-selection read voltage to the unselected memory cells to read the selected memory cells, and comparing data sensed in the first and second read operations to detect error locations of read data.

20 Claims, 14 Drawing Sheets

Fig. 3
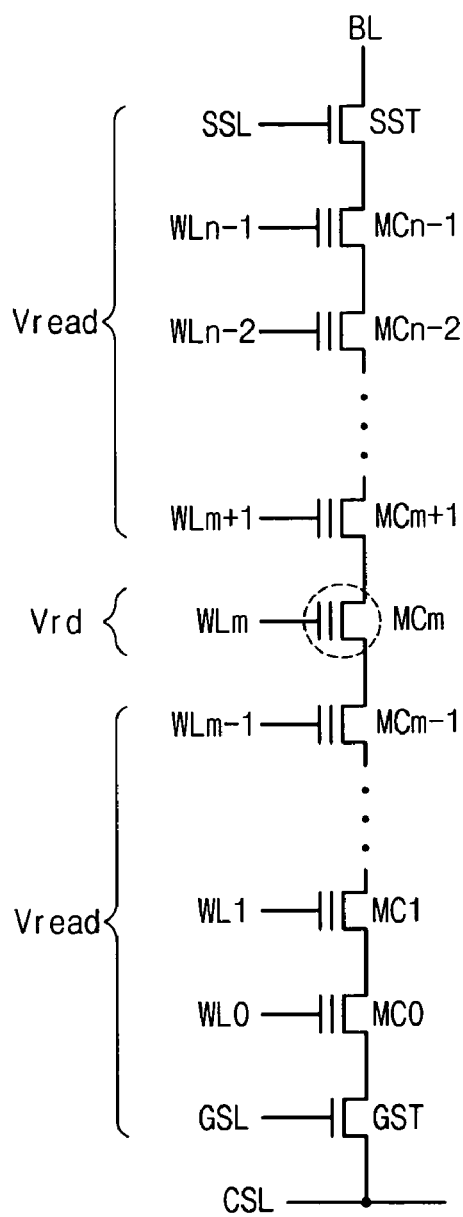
(a) Cell String
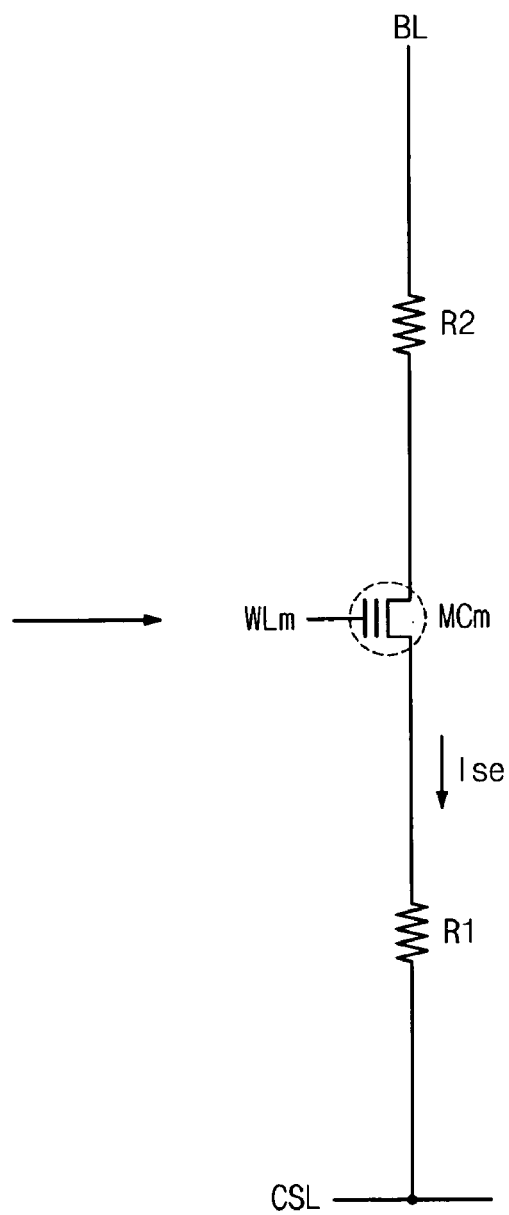
(b) Equivalent Circuit

NONVOLATILE MEMORY DEVICES AND ERROR CORRECTION METHODS THEREOF

CROSS-REFERENCE TO RELATED APPLICATION

This application claims priority under 35 U.S.C. §119 to U.S. Provisional Application No. 61/202,710, filed on Mar. 30, 2009, in the United States Patent and Trademark Office, the entire contents of which is incorporated herein by reference.

BACKGROUND

1. Field

Example embodiments of the inventive concepts relate to electronic devices, and more particularly, to memory devices and read error correction methods thereof.

2. Description of the Related Art

Typically, a semiconductor memory device may be classified as either a volatile memory or a nonvolatile memory. For example, a volatile memory may be a Dynamic Random Access Memory (DRAM) or a Static Random Access Memory (SRAM)). A nonvolatile memory may be, for example, a Ferroelectric Random Access Memory (FRAM), a Phase change Random Access Memory (PRAM), a Magnetoresistive Random Access Memory (MRAM) and/or a flash memory. A volatile memory may lose stored data when a power supply source is shut off. A nonvolatile memory may retain stored data even though the power supply source is shut off. Because a flash memory may have a high programming speed, may consume low power and may store large-scale data, it is widely used as a storage medium in computer systems.

Flash memory may be divided into a NOR type and a NAND type according to a connection state between a cell and a bit line. A NOR-type flash memory may have two or more cell transistors connected to one bit line in parallel, may store data using channel hot electron injection and may erase data using Fowler-Nordheim tunneling. A NAND-type flash memory may have two or more cell transistors connected to one bit line in series, and may store and erase data using Fowler-Nordheim tunneling.

Each memory cell may store 1-bit data and/or multi-bit data. In a case where 1-bit data is stored in one memory cell, the memory cell may have a threshold voltage corresponding to one of two threshold voltage states, for example, a data 1 and a data 0. In a case where 2-bit data is stored in one memory cell, the memory cell may have threshold voltages belonging to any one of four threshold voltage states. In a case where a 3-bit data is stored in one memory cell, the memory cell may have threshold voltages belonging to any one of eight threshold voltage states. Recently, research is being actively made into various technologies for storing 4-bit or greater data in one memory cell.

Because of increased integration density and the provision of multi-level cell (MLC) technology, interference between the cells of a flash memory device may increase and the read margin between threshold voltage distributions may be reduced. In highly integrated memory cells, because an oxide layer may be deteriorate as a number of program/erase cycles (P/E cycle) of the oxide layer increases, the life of a memory device may be shortened. Accordingly, research is being actively conducted into ensuring the life of a flash memory device and the reliability of stored data.

SUMMARY

Example embodiments of the inventive concepts provide semiconductor memory devices and an error correction methods thereof that may provide high-reliability reading of data.

Example embodiments of the inventive concepts may provide an error correction method in a nonvolatile memory device, the error correction method including: performing a first read operation of applying a first non-selection read voltage to a plurality of unselected memory cells to read a plurality of selected memory cells, performing a second read operation of applying a second non-selection read voltage less than the first non-selection read voltage to the unselected memory cells to read the selected memory cells, and comparing data sensed in the first and second read operations to detect error locations of read data.

Example embodiments of the inventive concepts may provide a nonvolatile memory device error correction method, the error correction method including applying a first non-selection read voltage to an unselected memory cell and reading first data from a selected memory cell, applying a second non-selection read voltage lower than the first non-selection read voltage to the unselected memory cell and reading second data from the selected memory cell and detecting first read error in read data by comparing the first and second data.

The first and second read operations may sense the selected memory cells according to a single level cell read mode. A selection read voltage for sensing the selected memory cells in each of the first and second read operations may have a ground level. The detecting of the error location may be set so that a location of each bit having different logic values between a first read data sensed in the first read operation and a second read data sensed in the second read operation may be determined as an error location. The error correction method may further include inverting a bit of the read data corresponding to the error location to correct an error.

According to example embodiments of the inventive concepts, a semiconductor memory device may include a nonvolatile memory providing data sensed from a plurality of selected memory cells and a memory controller sensing the selected memory cells to control the nonvolatile memory in order to output first and second read data, and comparing the first and second read data to detect and correct an error location of the data, in non-selection read voltage environments of different levels.

According to example embodiments of the inventive concepts, a semiconductor memory device may include a nonvolatile memory configured to sense read data from a plurality of selected memory cells, the nonvolatile memory configured to sense first and second data from each of the plurality of selected memory cells, the first and second data corresponding to non-selection read voltage environments of different levels and a memory controller configured to control the nonvolatile memory, the memory controller configured to compare the first and second data to detect read error and a read error location in the read data, the memory controller configured to correct the read error.

BRIEF DESCRIPTION OF THE DRAWINGS

Example embodiments will be more clearly understood from the following brief description taken in conjunction with the accompanying drawings. FIGS. 1-14 represent non-limiting, example embodiments as described herein.

FIG. 1 is a block diagram illustrating a memory system according to example embodiments of the inventive concepts;

FIG. 2 is a block diagram illustrating a flash memory according to example embodiments of the inventive concepts;

FIG. 3 includes circuit diagrams illustrating a bias condition and equivalent circuit of a cell string during a read operation;

FIG. 4 includes distribution diagrams illustrating threshold voltage shift due to a data retention characteristic and methods of correcting read error caused by the threshold voltage shift according to example embodiments of the inventive concepts;

FIG. 5 is a flowchart illustrating methods of detecting and correcting read error due to a data retention characteristic according to example embodiments of the inventive concepts;

FIG. 6 is a diagram illustrating the error detection and correction method of FIG. 5 with reference to a page of data;

FIG. 7 is a flowchart illustrating error detection and correction methods executed in a memory controller according to example embodiments of the inventive concepts;

FIG. 9 is a flowchart illustrating the methods of detecting and correcting data error described with reference to FIGS. 8A and 8B;

FIG. 10 is a block diagram of part of a cell array illustrating data error correction according to example embodiments of the inventive concepts;

FIG. 11 is a diagram comparing a conventional multi-level cell threshold distribution to a multi-level cell threshold distribution according to example embodiments of the inventive concepts;

FIG. 12 is a block diagram illustrating memory systems according to example embodiments of the inventive concepts;

FIG. 13 is a block diagram illustrating fusion memory devices and/or fusion memory systems according to example embodiments of the inventive concepts; and FIG. 14 is a block diagram illustrating computing systems including flash memory devices according to example embodiments of the inventive concepts.

Figure 1:
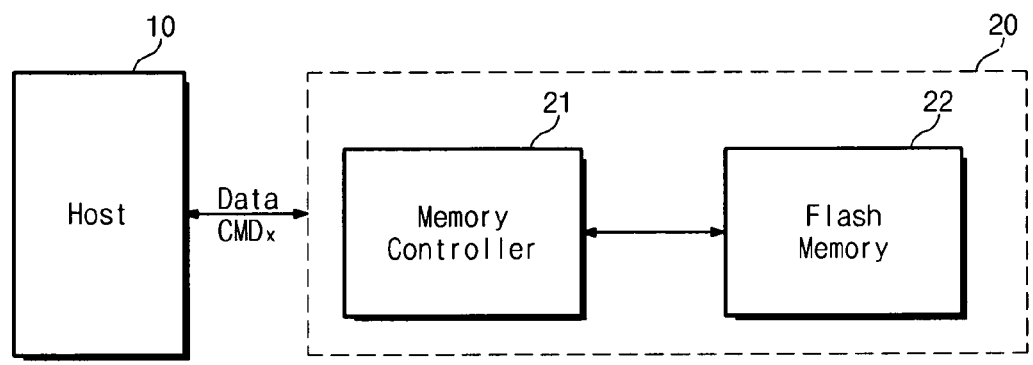

It should be noted that these Figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the example embodiments set forth herein; rather, these example embodiments are provided so that this disclosure will be thorough and complete, and will fully convey the concept of example embodiments of the inventive concepts to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the following description, although a flash memory device is used as an example of a nonvolatile memory for describing the features and functions of example embodiments of the inventive concepts, those skilled in the art understand that example embodiments of the inventive concepts are not so limited. For example, a PRAM, an MRAM, an ReRAM, an FRAM and/or a NOR flash memory may be used as a storage medium, and may be applied to a memory system where different memory devices may be used in common.

Moreover, "data retention characteristic," as used to describe example embodiments of the inventive concepts is a general term for a phenomenon in which the threshold voltage of a programmed memory cell may change over time. For example, over time, as more program operations are performed in a memory device, injected electric charges may leak from, for example, a deteriorated tunneling oxide layer. The tunneling oxide layer may deteriorate over time due to, for example, Hot Temperature Stress (HTS). The threshold voltage of a memory cell may be reduced as compared to a threshold voltage of the memory device after an initial programming. The threshold voltage may change in proportion to the elapse of time (e.g., according to a number of program/erase cycles performed). The data retention characteristic is an important characteristic related to the lifetime of a memory device and may be greatly affected by the number of program/erase cycles performed in the memory device.

A selection read voltage Vrd and a non-selection read voltage Vread are used as terms in the detailed description of example embodiments of the inventive concepts. The selection read voltage Vrd may be provided to the word line of a selected memory cell during a read operation and Vrd may be a voltage for determining the program state of the selected memory cell. The non-selection read voltage Vread may mean a voltage that is provided to the word line of memory cells which are not selected from a memory block including a selected memory cell during a read operation. The non-selection read voltage Vread is a voltage for turning on unselected memory cells during a read operation. The non-selection read voltage Vread may be also referred to as a pass voltage Vpass. In the description of example embodiments of the inventive concepts, the voltage Vread, however, is referred to as the non-selection read voltage Vread to distinguish Vread from the pass voltage Vpass used during a program operation.

FIG. 1 is a block diagram illustrating a memory system according to example embodiments of the inventive concepts. Referring to FIG. 1, a memory system may include a host 10 providing data Data and/or a command CMDx to a semiconductor memory device 20. The semiconductor memory device 20 may include a memory controller 21 interfacing with the host 10 and a flash memory 22. The memory controller 21 may control the flash memory 22 for writing data Data provided from the host 10 to the flash memory 22 in response to a writing command from the host 10. The memory controller 21 may control a read operation of the flash memory 22 in response to a read command from the host 10. The memory controller 21 may correct error caused by a data retention characteristic.

The memory controller 21 may control the flash memory 22 in order to read stored data from the flash memory 22 and/or write data in the flash memory 22 in response to a read/write request of the host 10. The memory controller 21 may detect and/or correct error included in read data transferred from the flash memory 22. The memory controller 21 may include an Error Control Coding (ECC) engine (not shown).

The read margin of a memory cell may be reduced due to an increase in integration density and/or implementation multilevel data storage. As a program/erase cycle (P/E cycle) increases, deterioration of a dielectric layer (e.g., a tunnel oxide layer) of the memory cells may increase. As deterioration of the dielectric layer increases, leakage of electric charges injected into a floating gate may occur. A data retention characteristic of the memory cell may be deteriorated and a lifetime of the flash memory 22 may be shortened. An error, which may be caused by an increase of integration density and/or deterioration of the data retention characteristic, may be primarily corrected by an ECC engine. As the error caused by the deterioration of the data retention characteristic increases the load of the ECC engine increases and an error correction ability may be restricted.

The memory controller 21 may sense an error caused by the deterioration of the data retention characteristic and correct the sensed error. The memory controller 21 may correct the error caused by the deterioration of the data retention characteristic while decreasing the load of the ECC engine. In a case where an uncorrectable error is caused by the ECC engine, the memory controller 21 may sense an error due to a data retention characteristic and additionally perform a correction procedure. The error correction ability may be improved.

The memory controller 21 may include an algorithm, called a Flash Translation Layer (FTL), between a file system and the flash memory 22 for concealing the deletion operation of the flash memory 22. The FTL may map a logical address generated by the file system to the physical address of a flash memory in which a deletion operation has been performed upon the writing operation of the flash memory 22.

The flash memory 22 may include a nonvolatile memory device capable of retaining stored data upon loss of power from a power supply source. The flash memory 22 may variably provide a non-selection read voltage Vread according to the control of the memory controller 211 during a read operation. The flash memory 22 may selectively provide any one of a plurality of non-selection read voltages having a plurality of levels to sense, for example, a selected page during a read operation. The flash memory 22 may include a high voltage generator for generating the non-selection read voltage Vread having a plurality of levels.

The memory system according to example embodiments of the inventive concept may correct an error bit due to the deterioration of the data retention characteristic of the memory cell. The memory system may improve the reliability of read data. Example embodiments of the inventive concepts may be applied to a memory system (e.g., a Solid State Disk (SSD)). The memory controller 21 may be configured to communicate with an external device (e.g., a host) through any one of various interface protocols, for example, USB, MMC, PCI-E, SATA, PATA, SCSI, ESDI and/or IDE.

Figure 2:
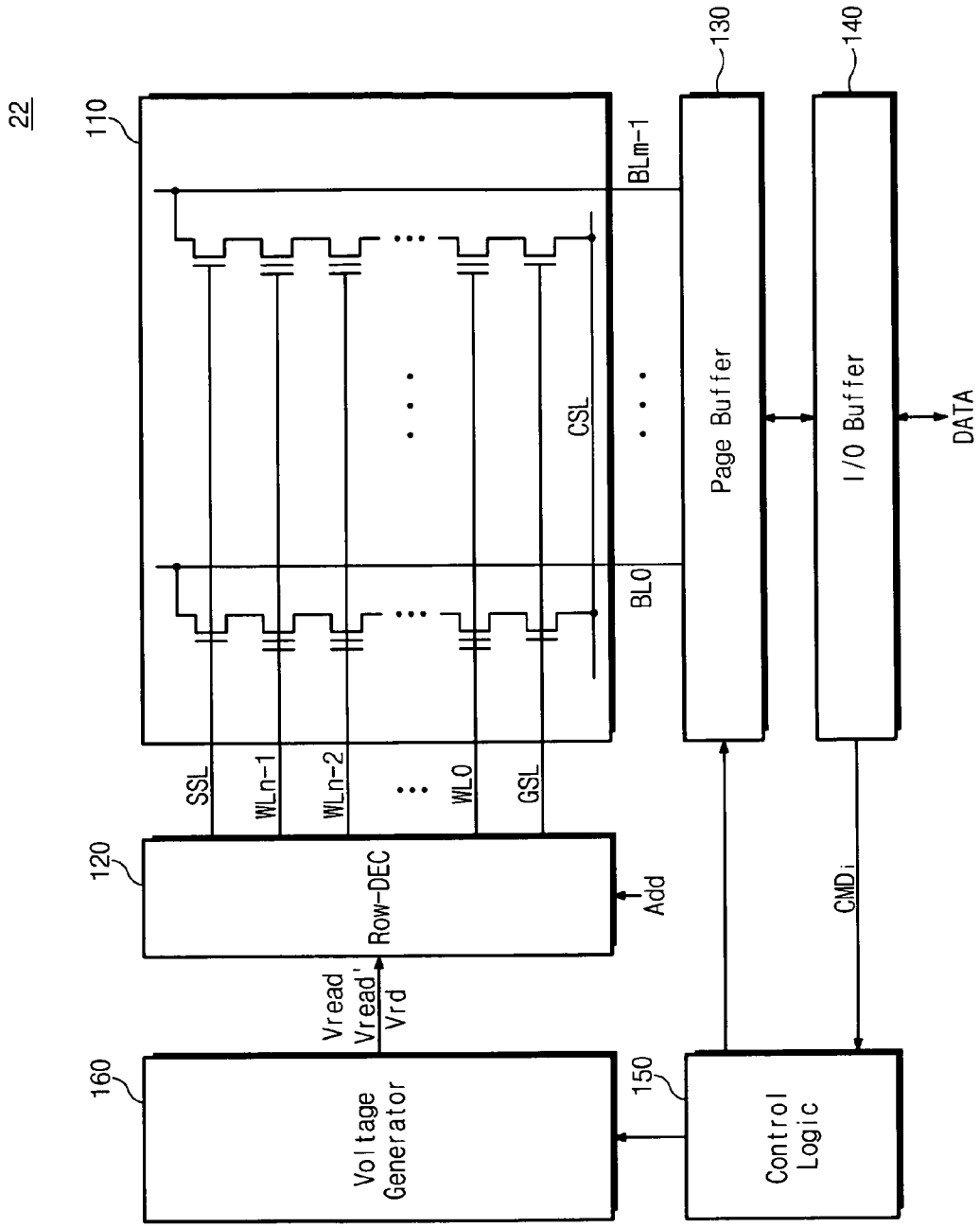

FIG. 2 is a block diagram illustrating a flash memory 22 according to example embodiments of the inventive concepts. Referring to FIG. 2, the flash memory 22 may perform an additional re-read operation for correcting an error due to a data retention characteristic according to the memory controller 21 (see FIG. 1) during a read operation. The re-read operation for correcting the error due to the data retention characteristic may include two read operations (e.g., first and second re-read operations). In conditions where different non-selection read voltages Vread are applied to a plurality of unselected word lines, each of the first and second re-read operations may sense a selected word line in a single level cell (SLC) read mode.

A cell array 110 may include a plurality of memory cells connected to a plurality of bit lines BL0 to BL(n−1) and a plurality of word lines WL0 to WL(n−1). A multi-level cell (MLC) may be programmed into any one of a plurality of threshold voltage states for storing a plurality of bits in one cell. The MLC may accommodate a number ($2^k$) of threshold voltage states corresponding to the number (k) of bits stored in a restricted threshold voltage window. A read margin of the MLC may be reduced relative to a SLC. The cell array 110 may be illustrated as one memory block.

A row decoder 120 typically selects a word line in response to a row address. The row decoder 120 may transfer different word line voltages applied from a voltage generator 160 to selected word lines. According to a program operation, the row decoder 120 may apply a program voltage (e.g., Vpgm of about 15 to 20 V) and a verification voltage (e.g., Vvfy) to a selected word line. The row decoder 120 may apply a pass voltage (e.g., Vpass) to an unselected word line. According to a read operation, the row decoder 120 may apply a selection read voltage Vrd from the voltage generator 160 to the selected word line and may apply a non-selection read voltage Vread to the unselected word lines. During a re-read operation for correcting the error due to a data retention characteristic, the row decoder 120 may vary a non-selection read voltage Vread to apply a varied voltage to the unselected word lines.

A page buffer 130 may operate as a writing driver and/or a sensing amplifier according to operation modes. For example, the page buffer 130 may operate as a sensing amplifier in a read operation mode and a writing driver in a program operation mode. The page buffer 130 may latch data sensed from the memory cells which are selected during a read operation and transfer the latched data to an input/output buffer 140 according to the control of the control logic 150.

The input/output buffer 140 may temporarily store an address and/or program data which is input through an input/output pin (e.g., I/Oi). The input/output buffer 140 may transfer a stored address to an address buffer (not shown), transfer program data to the page buffer 130, and/or transfer a command CMDi to the control logic 150 including a command register (not shown). During a read operation, read data provided from the page buffer 130 may be output to an external device (e.g., the memory controller) through the input/output buffer 140.

The control logic 150 may control the page buffer 130 and the voltage generator 160 according to procedures such as a program operation, a read operation and an erase operation, in response to the command CMDi from the memory controller 21. During the first and second re-read operations, the control logic 150 may control the page buffer 130 and the voltage generator 160 to sense the memory cells selected in the SLC read mode. During the second re-read operation, the control logic 150 may control the voltage generator 160 to output a non-selection read voltage Vread' that may be less than a typical non-selection read voltage Vread.

The voltage generator 160 may generate a direct current (DC) voltage according to the control of the control logic 150. During the first and second re-read operations, the voltage generator 160 may output the non-selection read voltages Vread and Vread' according to the control of the control logic 150. During the first and second re-read operations, the voltage generator 160 may output a selection read voltage (e.g., Vrd=about 0 V) which may be applied in the SLC read mode.

The flash memory 22 may perform first and second re-read operations for correcting error due to a data retention characteristic according to the control of the memory controller 21. During the first and second re-read operations, the read mode of the flash memory 21 may be based on a SLC read mode which may use the non-selection read voltages Vread and Vread', respectively, according to example embodiments of the inventive concepts. Although a threshold voltage of the memory cell may be in an erase state or a program state, the SLC read mode may be performed at high speed.

FIG. 3 includes circuit diagrams 3(a) and 3(b) illustrating a bias condition and an equivalent circuit, respectively, of a cell string during a read operation. Referring to FIG. 3(a), a cell string may include a ground selection transistor GST, a plurality of memory cells MC0-MC(n−1) and a string selection transistor SST connected in series between a common source line CSL and a bit line BL. The ground selection line GSL may be connected to the ground selection transistor GST, the memory cells MC0-MC(n−1) may be connected to respective word lines WL0-WL(n−1), and the string selection line SSL may be connected to the string selection transistor SST.

During a read operation, the row decoder 120 may apply a selection read voltage Vrd to the selected word line WLm. The non-selection read voltage Vread may be applied to a plurality of unselected word lines WL0-WL(m−1) and WL(m+1)-WL(n−1). The non-selection read voltage Vread may be a voltage great enough to turn on memory cells connected to the unselected word lines WL0-WL(m−1) and WL(m+1)-WL(n−1). A voltage pre-charged on the bit line BL may be discharged to the common source line CSL or may be maintained according to whether the memory cell MCm connected to the selection word line WLm is turned on or off.

Referring to the equivalent circuit of the cell string of FIG. 3(b) in the above-described bias condition, the memory cells MC0-MC(m−1) and MC(m+1)-MC(n−1) receiving the non-selection read voltage may be modeled with resistors R1 and R2 in the cell string, respectively. The amount of a sensing current Ise may be determined according to whether the selected memory cell MCm is turned on or off.

Figure 4:
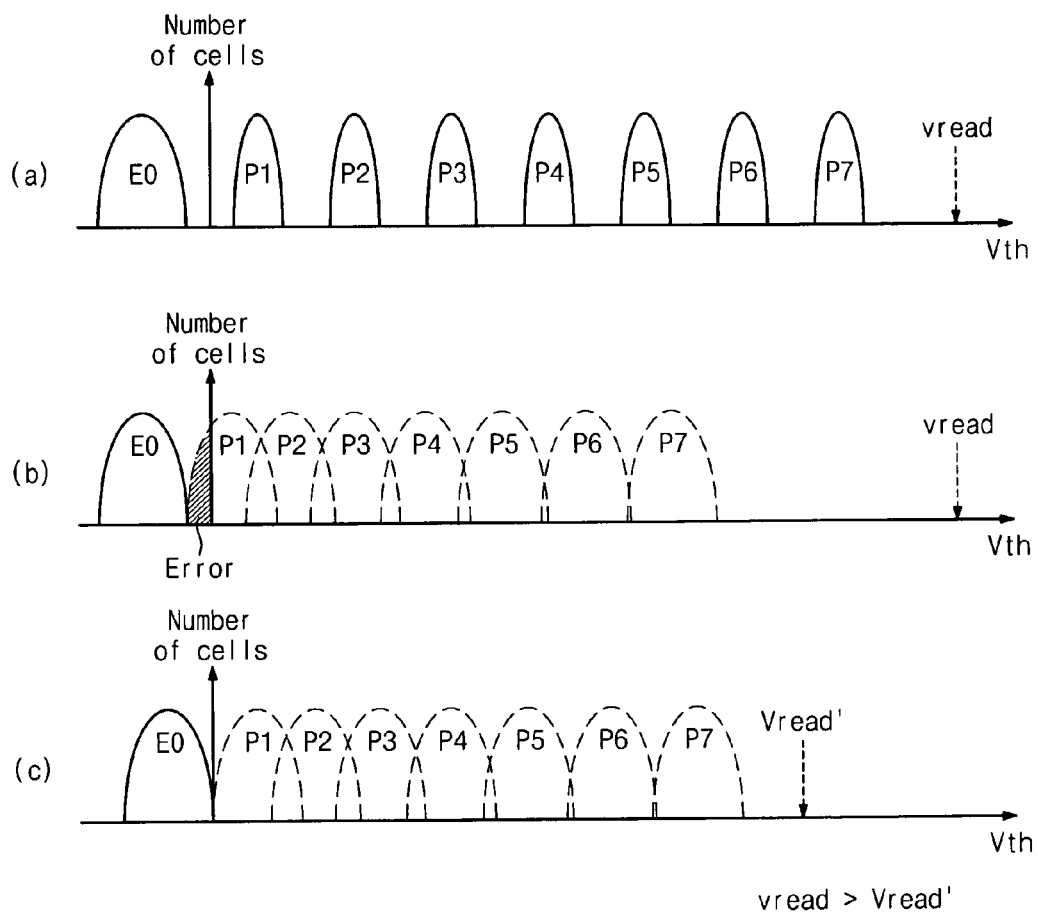

FIG. 4 includes distribution diagrams illustrating threshold voltage shift due to a data retention characteristic and methods of correcting read error caused by the threshold voltage shift according to example embodiments of the inventive concepts. Referring to FIG. 4, threshold voltage shift may be compensated for through the control of non-selection read voltages Vread and Vread'. The distribution diagram of FIG. 4(a) may illustrate a threshold voltage distribution immediately after the programming of the memory cells and/or before the data retention characteristic appears. A spread of threshold voltages due to deterioration of the tunnel oxide layer may not cause error. Accordingly, the non-selection read voltage Vread for turning on unselected memory cells may be used.

The distribution diagram of FIG. 4(b) may illustrate a threshold voltage spread after an elapse of time following the programming of the memory cells and/or after a data retention characteristic appears. Due to the data retention characteristic, each of the threshold voltages of the memory cells may be spread upward and/or downward. A threshold voltage may become less than about 0 V in memory cells corresponding to a program state P1. During a read operation by the non-selection read voltage Vread and the selection read voltage (e.g., Vrd=0 V), among the memory cells included in the program state P1, the memory cells where a threshold voltage becomes less than about 0 V may output erroneous data. The memory cells of the hatched area of FIG. 4 may read as logic 1.

Threshold voltage reduction due to a data retention characteristic may be due to deterioration of the selected cell and/or an influence of unselected memory cells having shifted threshold voltages. A threshold voltage reduction in the selected cell may be occur where electric charges, injected into a floating gate and/or a tunnel oxide layer, are leaked from the selected cell. For example, electric charges injected through a deteriorated tunnel oxide layer may be leaked into a channel due to, for example, Hot Temperature Stress (HTS).

A threshold voltage reduction in the selected cell may occur where the threshold voltage of the selected memory cell is reduced by decreased threshold voltages of the unselected memory cells. In the equivalent circuit of the cell string of FIG. 3(b) described above, as the threshold voltages of the unselected memory cells are reduced, the equivalent resistors R1 and R2 which model the unselected memory cells may be reduced. The sensing current Ise of the selected memory cell MCm may increase according to the decrease of the equivalent resistors R1 and R2. The threshold voltage of the selected memory cell MCm may decrease according to an increase of the sensing current Ise.

The distribution diagram of FIG. 4(c) illustrates restoration of a threshold voltage according to read methods of example embodiments of the inventive concepts. The distribution diagram of FIG. 4(c) may illustrate a bias condition for correcting threshold voltage shifts due to unselected memory cells. A decrease of the equivalent resistors R1 and R2 corresponding to the unselected memory cells may be compensated for through the provision of a non-selection read voltage Vread' that may be less than a non-selection read voltage Vread. A channel width-height ratio of a cell transistor constituting the memory cell may vary according to the level of a gate voltage. If the level of the gate voltage is reduced, channel sizes of unselected memory cells may be reduced and a resistance may increase.

Among the memory cells corresponding to the program state P1, the memory cells corresponding to a threshold voltage reduced to less than about 0 V may have a threshold voltage adjusted to be greater than about 0 V according to example embodiments. Error of the memory cells programmed into the program state P1 may be corrected and/or reduced by provision of the bias condition.

Figure 5:
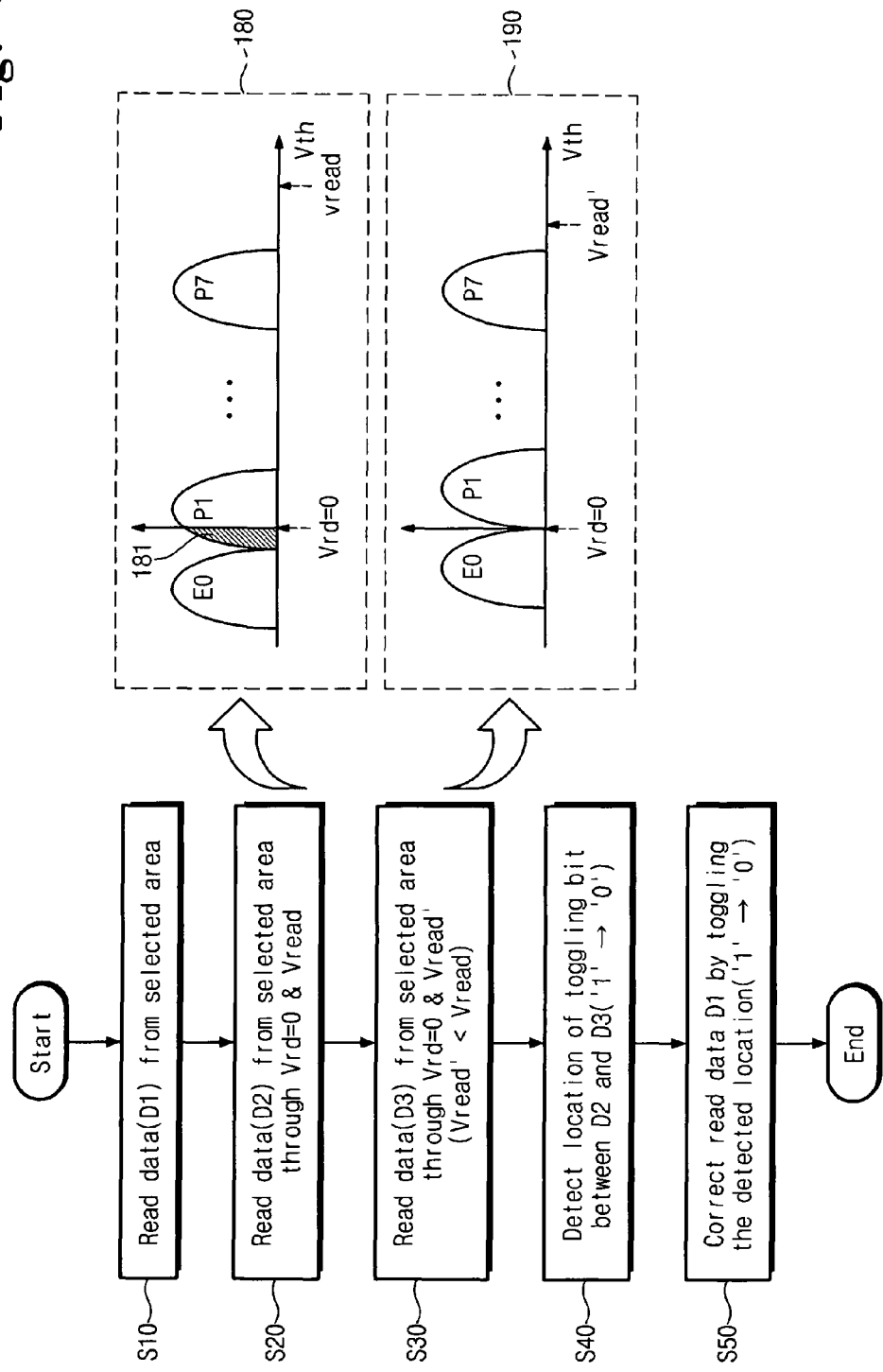

FIG. 5 is a flowchart illustrating methods of correcting read error due to a data retention characteristic including the control of a non-selection read voltage (e.g., as described with reference to FIG. 4) according to example embodiments of the inventive concepts. FIG. 5 may illustrate an error correction method for memory cells where a threshold voltage is reduced to less than 0V in one or more memory cells corresponding to the programs state P1.

A read operation may be performed on, for example, a selected area of a cell array. For example, one page data D1 selected by the memory controller 21 may be read out. For purposes of explanation, the read data D1 may be, for example, any one page data of a plurality of pages stored in a 3-bit MLC. During reading of the data D1 the non-selection read voltage Vread may be applied to the unselected word lines. Error due to the data retention characteristic may be included in the data D1. If error due to the data retention characteristic is included in the data D1, the data D1 may not be output to the host 10 (see FIG. 1) but may be temporarily stored in an area of the semiconductor memory device 20 in operation S10.

Two re-read operations for correcting and/or reducing error may be disclosed. The re-read operations may include a first re-read performed using the non-selection read voltage Vread and the selection read voltage (Vrd=about 0 V), and a second re-read performed using the non-selection read voltage Vread' and the selection read voltage (Vrd=about 0 V). As illustrated in the distribution diagram 180 of FIG. 5, a first re-read may be performed in the SLC read mode for the memory cells selected in operation S10. During the first re-read operation, whether the threshold voltage is greater or less than about 0 V is sensed in the selected memory cells. The first re-read operation turns on the unselected memory cells by using the non-selection read voltage Vread applied in typical read modes. Among the memory cells corresponding to the program state P1 in a data D2, the memory cells where the threshold voltage is reduced to less than 0 V may be sensed as logic 1 in operation S20.

As illustrated in the distribution diagram 190 of FIG. 5, the second re-read operation uses a non-selection read voltage Vread' which may be a lower voltage than the non-selection read voltage Vread used in the first re-read operation. The threshold voltages of the selected memory cells may be sensed as they may be increased according to the non-selection read voltage Vread'. The threshold voltage of memory cells 181 corresponding to the program state P1 where the threshold voltage is reduced to less than about 0 V may be sensed as greater than 0 V. A data D3 sensed by the second re-read operation may be temporarily stored. The second re-read operation may also be performed in the SLC read mode in operation S30.

A comparison of the data D2 and D3 sensed by the respective re-read operations may be performed. The memory cells 181, which may have threshold voltages reduced to less than about 0 V in the data D2, may be sensed by the second re-read operation as having threshold voltages greater than about 0 V. The memory cells 181 corresponding to an error bit may be sensed as logic 1 in the data D2 and may be sensed as logic 0 in the data D3. Error location of a corresponding page may be detected through the comparison of the re-read data D2 and D3 in operation S40.

The detection of the error location due to the data retention characteristic may denote that the error of the data D1 may be corrected. The location of a bit in which the bit of the logic 1 in the data D2 is inverted into the logic 0 in the data D3 may be an error location. By inverting the bit value of the data D1 corresponding to the error location an error correction may be performed in operation S50. The detection and correction of the error due to the data retention characteristic may be performed independently of an ECC engine. Because the two re-read operations may be performed in the SLC read mode capable of reading at high speed a load due to error correction may be minimized and/or reduced.

Figure 6:
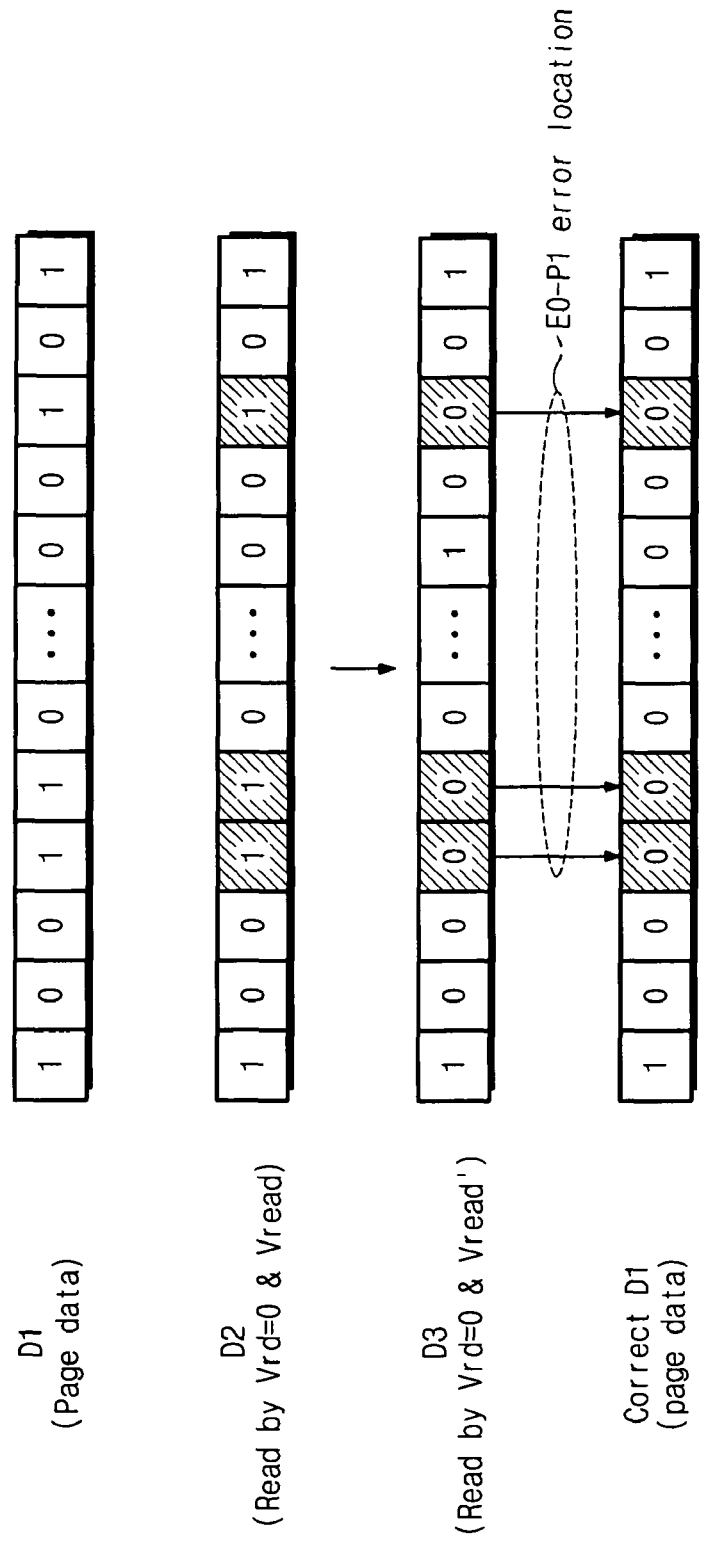

FIG. 6 is a diagram illustrating the error detection and correction method of FIG. 5 with reference to a page of data. The data D1 output according to a read operation of the selected area may be illustrated in FIG. 6. If an error is included in the data D1, it may be detected and corrected by the ECC engine. The error due to the data retention characteristic may restrict the error correction ability of the ECC engine. If an error of a number of bits exceeding the error correction ability of the ECC engine is detected the memory controller 21 may be set to execute an error detection and correction algorithm according to example embodiments of the inventive concepts.

Data D2 and D3 may be sensed through first and second re-read operations performed according to the SLC read mode as illustrated in FIG. 6. An error bit that is sensed as the logic 1 in the data D2 and is sensed as the logic 0 in the data D3 may be illustrated as a hatched portion. The error bits may be detected through the comparison of the data D2 and D3. The conversion location of a bit value occurring in one page according to the first and second re-read operations may be the same as the location of the error bit. The location of the error bit due to the data D2 and D3 re-read by the SLC read mode may mean the error of the memory cell programmed into the program state P1.

If the location of an error bit is detected, by converting a bit corresponding to the error bit location in the data D1 from the logic 1 into the logic 0, error correction may be performed. After the correction of the error due to the data retention characteristic, the error correction by the ECC engine may be performed. Because the number of error bits has decreased by the preceding re-read operations the load of the error correction by the ECC engine may be reduced.

Figure 7:
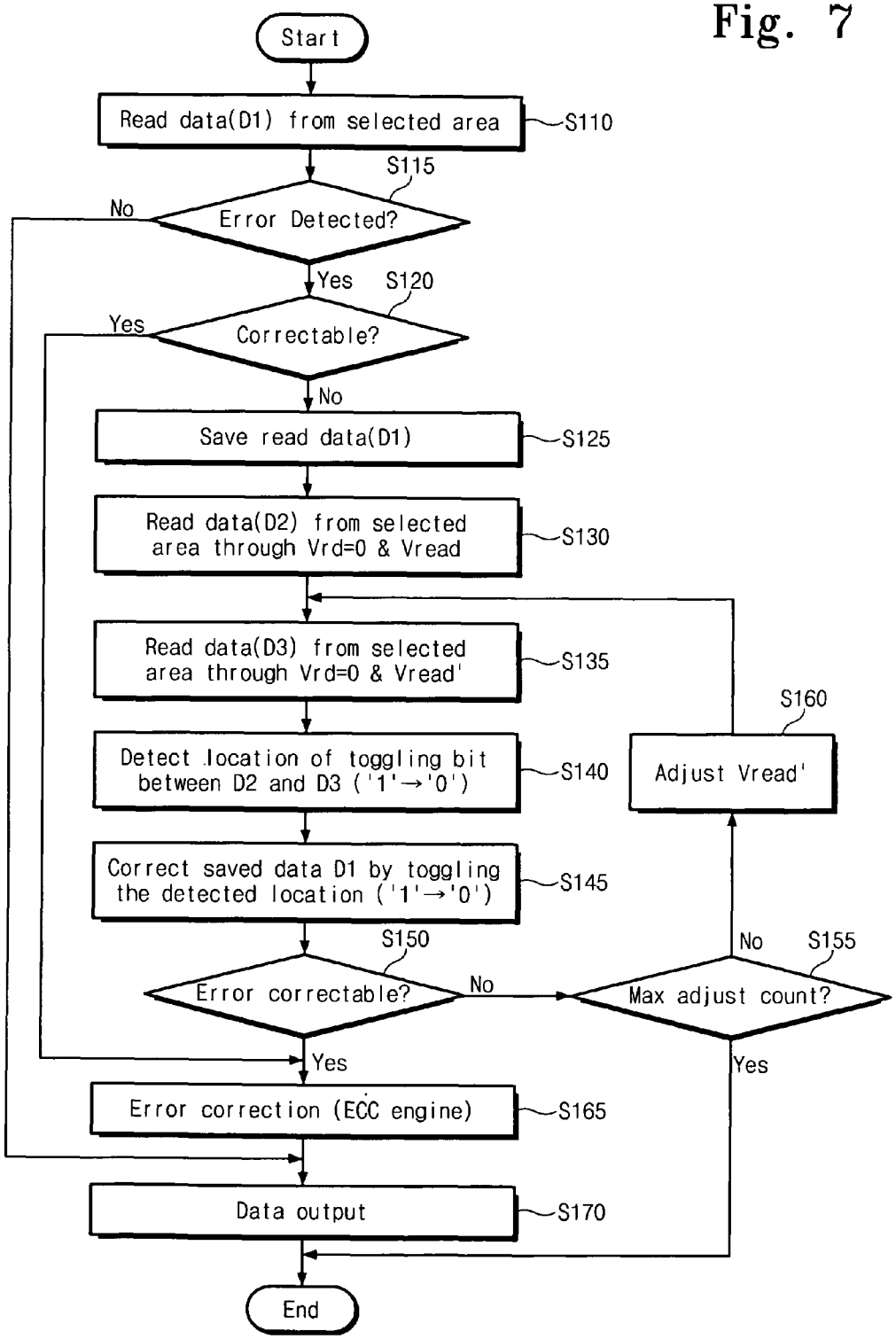

FIG. 7 is a flowchart illustrating error correction methods executed in a memory controller 21 according to example embodiments of the inventive concepts. Referring to FIG. 7, in a case where it may be impossible and/or difficult to correct an error in the ECC engine, a procedure for detecting and correcting an error due to the data retention characteristic may be performed. When there is a request from the host 10 (see FIG. 1), the memory controller 21 may control the flash memory 22 to sense data of a selected cell area. The memory controller 21 may receive data D1 from the flash memory 22 in operation S110.

The memory controller 21 may detect whether error exists in the read data D1. The detection of the error may be performed through the ECC engine in operation S115. When error is detected in the read data D1 the memory controller 21 may output the read data D1 to the host 10 in operation S170. When error is detected in the read data D1, operation S120 may be performed to determine whether a detected error is a correctable error or an uncorrectable error.

When the error included in the read data D1 is an error capable of being corrected by ECC engine operation S165 may be performed to correct the detected error. When an error correction operation is completed by the ECC engine the corrected data may be output to the host 10 in operation S170. When error in the read data D1 may not be corrected by the ECC engine an operation for selectively correcting an error due to a data retention characteristic according to example embodiments of the inventive concepts may be performed.

The read data D1 may be stored in a memory area in operation S125. A first re-read operation may be performed for detecting an error location due to a data retention characteristic according to the SLC read mode. Upon a first re-read operation, a selected memory area may be read according to the selection read voltage (Vrd=about 0 V) and the non-selection read voltage Vread. The output data D2 may be temporarily stored in operation S130.

The second re-read operation may be performed according to the SLC read mode. During the second re-read operation the selection read voltage (Vrd=about 0 V) and the non-selection read voltage Vread' that may be less than the voltage Vread applied during the first re-read operation may applied. By providing of the non-selection read voltage Vread' the threshold voltages of the unselected memory cells may be increased. Threshold voltages of the memory cells corresponding to the program state P1 where the threshold voltage is sensed as less than about 0 V upon the first re-read operation may increase and the sensing current Ise may be reduced. The threshold voltages of the selected memory cell may be relatively increased. The read data D3 of the second re-read operation may be transferred to the memory controller 21 in operation S135.

The data D2 and D3 output by the re-read operations may be used in a comparison operation for determining error location. The memory cells 181 corresponding to an error bit may have bit value of a logic 1 in the data D2 and have the bit value of the logic 0 in the data D3. A location where a bit conversion occurs in the re-read data D2 and D3 may be detected as the error location in operation S140. The detected error location may correspond to the error location of the read data D1 stored in a certain area. By toggling the bit of the read data D1 corresponding to the detected error location the error due to the data retention characteristic may be corrected in operation S145.

The error of the read data D1 in which the error due to the data retention characteristic has been corrected may be detected by the ECC engine. When the detection result shows that the number of error bits is correctable after the correction of the error due to the data retention characteristic, operation S165 may be performed to execute error correction. When the detection result shows that the error may not be corrected after the correction of the error due to the data retention characteristic, operation S155 may be performed to adjust the non-selection read voltage Vread'.

The adjustment of the non-selection read voltage Vread' may not be continuously repeated. A maximum number of counts (Max adjust count) for adjusting the non-selection read voltage Vread' may be restricted and a procedure may be set to be ended when the maximum number of counts (Max adjust count) is reached. When the maximum number of counts (Max adjust count) is not reached, operation S160 may be performed to adjust the non-selection read voltage Vread'. The second re-read operation may be repeated by the selection read voltage (Vrd=about 0 V) and the adjusted non-selection read voltage Vread' in operation S135. Operations S140 and S145 may also be repeated in which the error location due to the data retention characteristic is detected and corrected. When it is determined that the error may be corrected within the maximum number of counts, the error of the read data D1 may corrected by the error correction operation in operation S165. The corrected data may be output to the host 10.

According to error detection and correction methods based on a data retention characteristic the number of error bits may be reduced independently of the ECC engine. Error detection and correction methods according to example embodiments of the inventive concepts may narrow a gap between an erased state E0 and a program state P1. A load on the ECC engine may be reduced. If the gap between the erased state E0 and the program state P1 narrows the gap between program states P1-P7 may relatively widen within the same threshold voltage window. The read margin of the each program state may be additionally ensured, and thus, reliability for the read data may further increase.

Figure 8A:
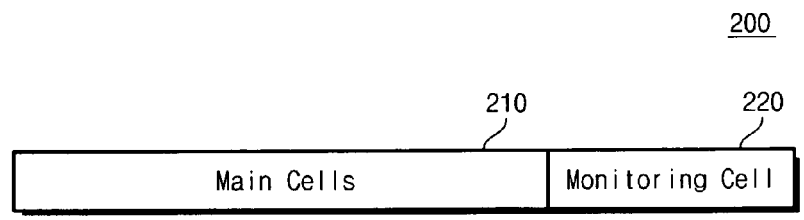
FIGS. 8A and 8B are diagrams illustrating methods of detecting and correcting data error according to example embodiments of the inventive concepts.
Figure 8B:
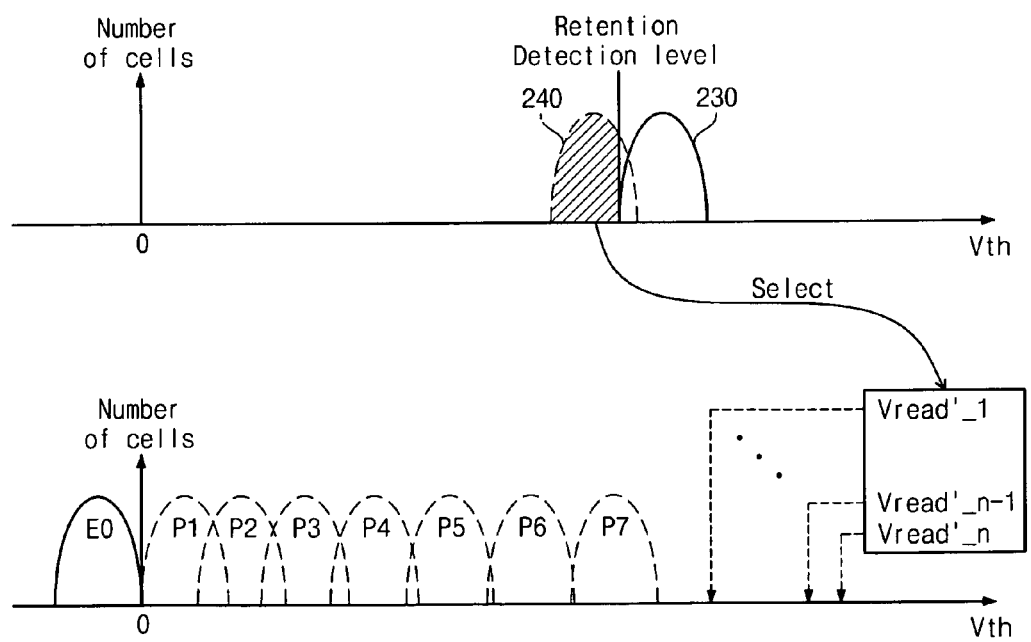

FIGS. 8A and 8B are diagrams illustrating methods of detecting and correcting data error according to example embodiments of the inventive concepts. Referring to FIGS. 8A and 8B, an adjustment loop of the non-selection read voltage Vread' which is repeatedly performed for the second re-read operation according to example embodiments illustrated in FIG. 7 may be omitted. According to example embodiments, the second re-read operation for detecting and correcting the error due to the data retention characteristic may be performed only once.

FIG. 8A illustrates a cell array 200 of, for example, a flash memory 22. The cell array 200 may include a monitoring cell area 220 for determining the non-selection read voltage Vread' used during the second re-read operation. A plurality of main cell areas 210 may include corresponding monitoring cell areas 220. The monitoring cell area 220 may be included for each word line unit and may be allocated for each memory block unit. One or more monitoring cells may be included in the monitoring cell area 220.

According to example embodiments of the inventive concepts the monitoring cells may be sensed to provide information of the data retention characteristic of the main cell area 210. The monitoring cell area may be read once to detect a degree of threshold voltage shift due to a data retention characteristic. The monitoring cells of the monitoring cell area 220 may be programmed into the greatest threshold voltage state of the program states. Memory cells programmed into the greatest threshold value state may be the most sensitive to stress due to a data retention characteristic (e.g., P7).

FIG. 8B is a diagram illustrating reading of the monitoring cells of the monitoring cell area 220 and the selection process of the non-selection read voltage Vread'. The monitoring cells of the monitoring cell area 220 may be programmed into a program state 230. The program state 230 may shift to the threshold voltage distribution 240 by, for example, HTS and/or the data retention characteristic (e.g., leakage of electric charges). The memory cells programmed into the program state P1 in the main cell area 210 may also shift proportionally to the shift of the threshold voltage of the monitoring cells.

A read operation of the monitoring cells of the monitoring cell area 220 may be performed at a retention detection level. Among data read at the retention detection level, the number of bits (hereinafter referred to as fail bits) corresponding to an on-cell may be counted. The memory cells corresponding to fail bits correspond to the lower portion (e.g., hatched portion) of the retention detection level in the threshold voltage distribution 240. The level of the non-selection read voltage Vread' may be determined according to the number of the fail bits. A non-selection read voltage Vread'_x may be determined according to the number of the fail bits. In this case, because the repetitive loop of the second re-read operation for adjusting the non-selection read voltage Vread' need not be performed the speed of the error correction operation may increase.

According to example embodiments of the inventive concepts a non-selection read voltage Vread' is selected according to a read operation of the monitoring cell area 220 and a count of fail bits. The leakage degree of the electric charges may be sensed and quantified according to the read operation of the monitoring cell area 220 in real time.

Figure 9:
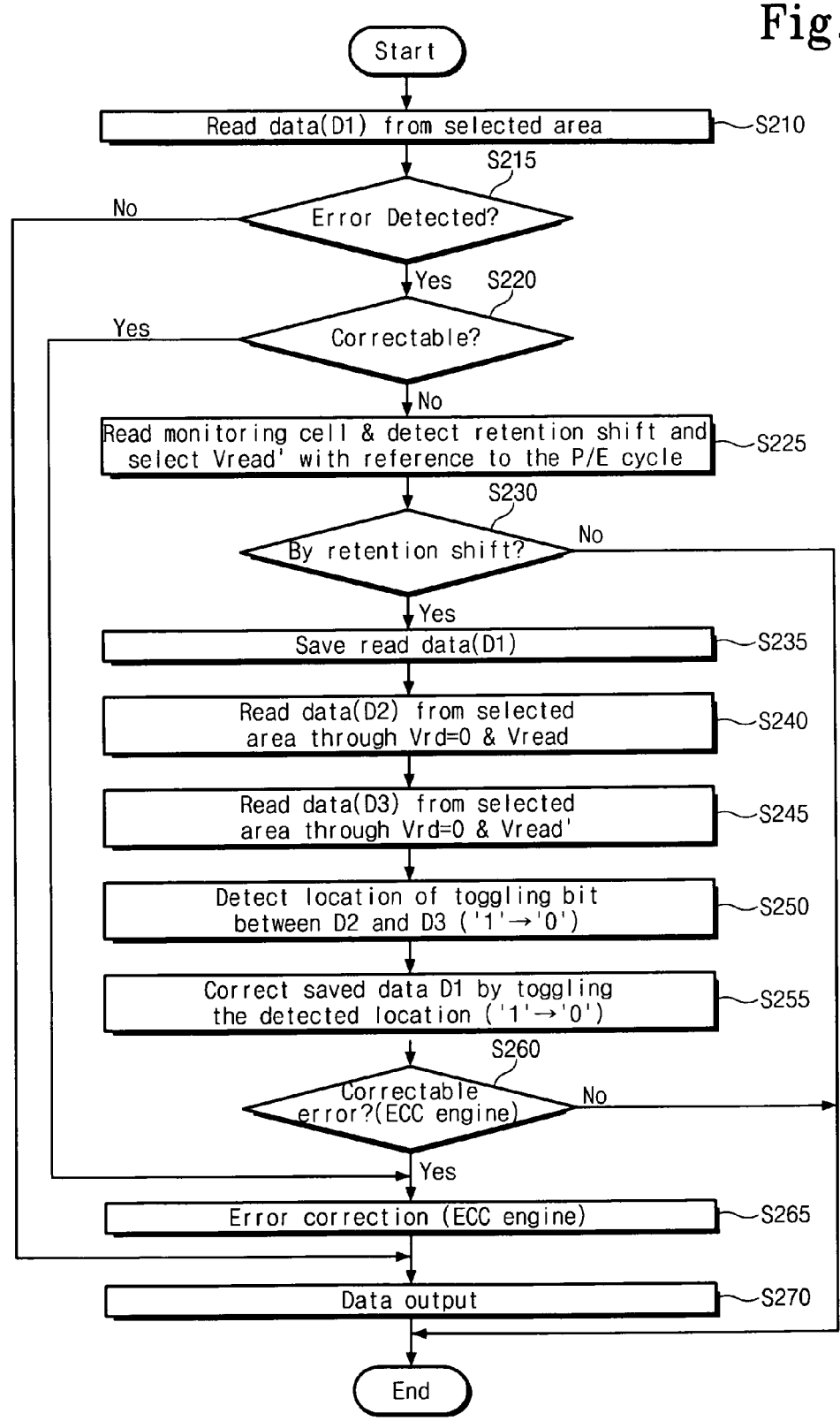

FIG. 9 is a flowchart illustrating the methods of detecting and correcting data error described with reference to FIGS. 8A and 8B. Referring to FIG. 9, methods of detecting and correcting data error may include a read operation of a monitoring cell area and selection procedures for selecting a non-selection read voltage Vread' of the second re-read operation. A repetitive loop for storing the non-selection read voltage Vread' as illustrated in FIG. 7 may not be included in the flowchart of FIG. 9.

When there is a request from, for example, the host 10, the memory controller 21 may control the flash memory 22 to sense data of a selected cell area. The memory controller 21 may receive the sensed data D1 from the flash memory 22 in operation S210. The memory controller 21 may detect whether or not error exists in the received read data D1. The detection of the error may be performed through an ECC engine in operation S215. When error is not detected in the read data D1 the memory controller 21 may output the read data D1 to, for example, the host 10 in operation S270. When error is detected in the read data D1, operation S220 may be performed to determine whether a detected error is a correctable error or an uncorrectable error.

When error included in the read data D1 is an error correctable by an ECC engine, operation S265 may be performed to correct the detected error. When an error correction operation is completed by the ECC engine the corrected data may be output to, for example, the host 10 in operation S270. When error included in the read data D1 may not be corrected by an ECC engine an operation for correcting an error due to the data retention characteristic according to example embodiments of the inventive concepts may be performed.

A read operation of the monitoring cell area 220 (see FIG. 8A) may be performed. The method may detect whether a threshold voltage shift due to a data retention characteristic is the cause of the data error by reading the monitoring cell area 220. The detection of the data retention characteristic may be performed with reference to the number of the program/erase cycles (P/E cycle) because the data retention characteristic may reduce a threshold voltage as a function of the number of the program/erase cycle (P/E cycle) in a non-linear manner. The method may select the optimal non-selection read voltage Vread' with reference to the number of the fail bits occurring according to the read operation of the monitoring cell area 220 in operation S225.

When error occurring according to a data retention characteristic is not correctable a procedure may be ended and/or the error may be corrected by different data process method (not shown). When it is determined through the reading of the monitoring cell area that the error is caused by a data retention characteristic, operation S235 may be performed to detect and correct error in the read data D1 due to the data retention characteristic.

Operations S235, 5240, 5245, 5250 and S255 may be substantially the same as operations S125-S145 of FIG. 7. A repetitive loop for the adjustment of a non-selection read voltage Vread' may not be included in example embodiments described with reference to FIG. 9. In operation S245, the second re-read operation may be performed by using the non-selection read voltage Vread' determined through the reading of the monitoring cell area 220. Because the specific operations of operations S235, S240, S245, 5250 and S255 may be substantially the same as described with reference to FIG. 7 they are not described again.

Operation S255 may be performed to detect error in the read data D1 by the ECC engine in operation S260. When an uncorrectable error is detected in the data D1 where error has been corrected using a monitoring cell area, an overall procedure may be ended and/or the error may be corrected by a different data process method (not shown). When correctable error is detected or error is not detected in the data D1 where error has been corrected using a monitoring cell area, operation S265 may be performed to correct error or operation S270 may be performed to output data.

Example embodiments of the inventive concepts may include methods of detecting and correcting error using a monitoring cell area. If a monitoring cell area is used, the optimal and/or improved empirically determined non-selection read voltage Vread' may be selected. A read speed may increase.

Figure 10:
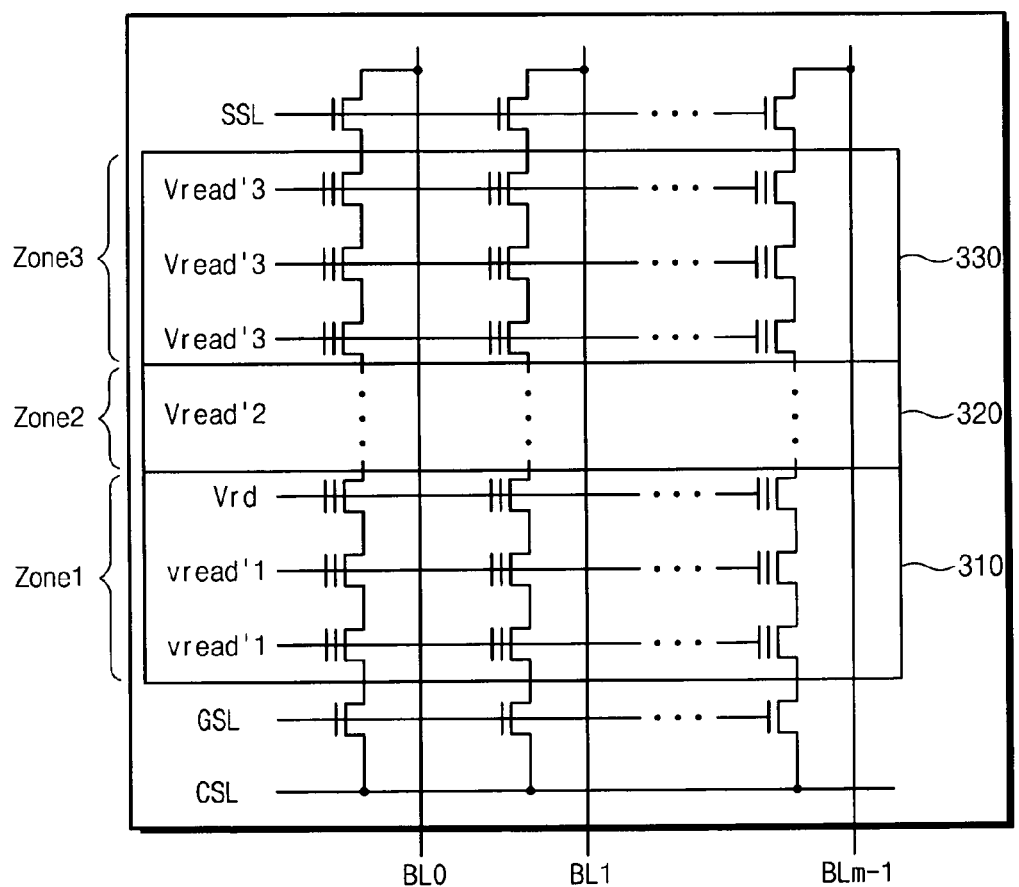

FIG. 10 is a block diagram of part of a cell array illustrating data error correction according to example embodiments of the inventive concepts. Referring to FIG. 10, a level of a non-selection read voltage Vread' provided in a re-read operation according to example embodiments of the inventive concepts may be provided according to a row address. A non-selection read voltage Vread' may be a different value according to the location (area) of the word line. A device (e.g., a flash memory device) may be set, for example, so that during a second re-read operation a non-selection read voltage Vread'1 may be applied to the unselected word lines of a first zone 310 (Zone 1), a non-selection read voltage Vread'2 may be applied to the unselected word lines of a second zone 320 (Zone 2) and a non-selection read voltage Vread'3 may be applied to the unselected word lines of a third zone 330 (Zone 3). According to example embodiments of the inventive concepts an applying condition of the non-selection read voltage may be set according to the location of the selection word line receiving the selection read voltage Vrd.

Figure 11:
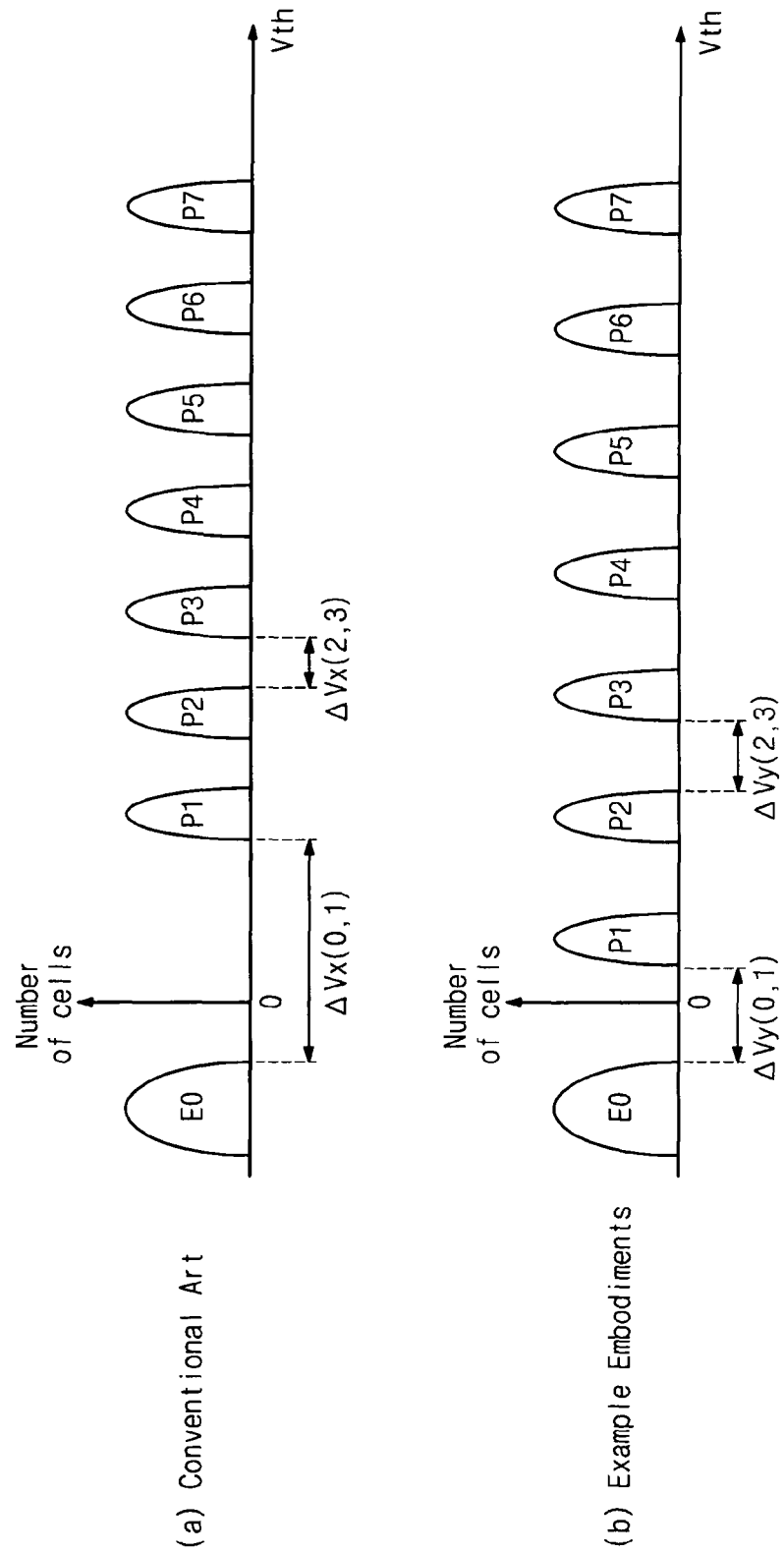

FIG. 11 is a diagram comparing a conventional multi-level cell threshold distribution to a multi-level cell threshold distribution according to example embodiments of the inventive concepts. Referring to FIG. 11, example embodiments of the inventive concepts may decrease an error correction load of an ECC engine and may ensure a gap between program states P1-P7, thereby increasing a read margin.

In a flash memory using conventional technology, as shown in FIG. 11(a), data states may be arranged. The flash memory may have to ensure a sufficient gap ($\Delta Vx(0,1)$) between the erase state E0 and the program state P1 for preventing an error caused by drops in threshold voltages of the memory cells corresponding to the program state P1. A gap between the program states P1-P7 may narrow within a restricted threshold voltage window. For example, as the gap ($\Delta Vx(0,1)$) widens, a gap ($\Delta Vx(2,3)$) between the program states P2 and P3 may narrow. A gap between the remaining program states may also narrow.

Referring to FIG. 11(b), in a case where the error correction technology according to example embodiments of the inventive concepts is applied, a sufficient gap may not need to be ensured between an erase state E0 and a program state P1. Even if the gap between the erase state E0 and the program state P1 is equal to a gap ($\Delta Vy(0,1)$), relevant limitations may be solved by error correction according to example embodiments of the inventive concepts. A gap between the program states P1-P7, for example, a gap ($\Delta Vy(2,3)$) may further widen within a restricted threshold voltage window and a read margin may be increased over the conventional art.

Figure 12:
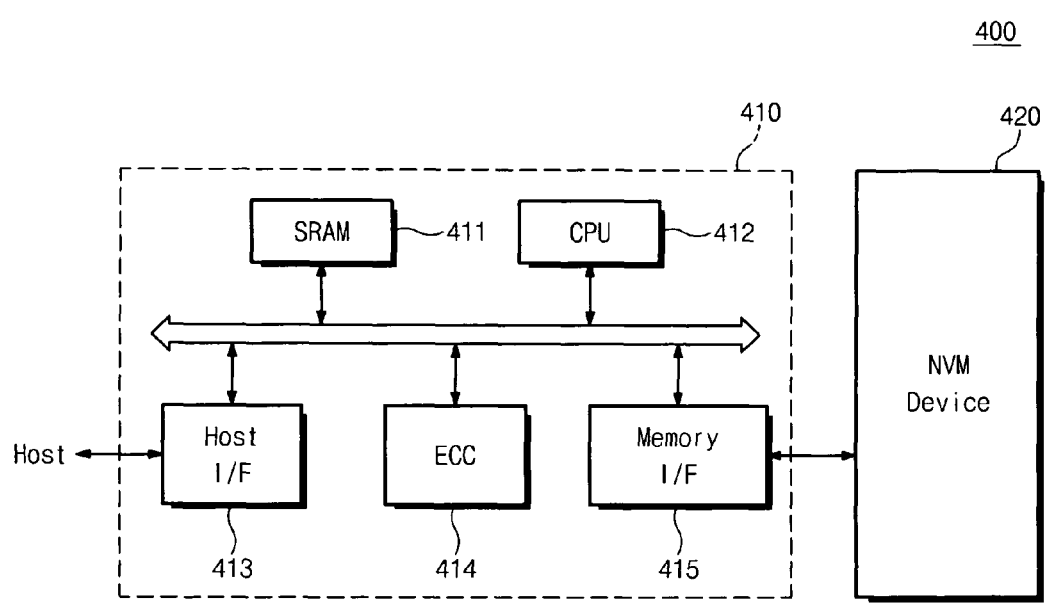

FIG. 12 is a block diagram illustrating memory systems according to example embodiments of the inventive concepts. Referring to FIG. 12, a memory system 400 according to example embodiments may include a nonvolatile memory device 420 and a memory controller 410. The nonvolatile memory device 420 may be configured with a flash memory device including a cell array 110 illustrated in FIG. 2. The memory controller 410 may control the nonvolatile memory device 420. The memory system 400 may be, for example, provided as a memory card and/or a Solid State Disk (SSD) by combining the nonvolatile memory device 420 and the memory controller 410. An SRAM 411 may be used as the operation memory of a processing unit 412. A host interface 413 may include the data exchange protocol of a host connected to the memory system 400. An error correction block (ECC) 414 may detect and correct error included in data read from the nonvolatile memory device 420.

The memory interface 415 may interface with the nonvolatile memory device 420. The processing unit 412 may perform an overall control operation for the data exchange of the memory controller 410. Although not shown, it is obvious to those skilled in the art that the memory system 400 may further include, for example, a read-only memory (ROM) (not shown) storing code data for interfacing the host. The nonvolatile memory device 420 may be provided, for example, as a multi-chip package including a plurality of flash memory chips. The memory system 400 may be provided as a high-reliability storage medium where the occurrence probability of an error is low. The flash memory device according to example embodiments of the inventive concepts may be included in the memory system, for example, an SSD. In this case, the memory controller 410 may be configured to communicate with an external device (e.g., a host) through any one of various interface protocols, for example, USB, MMC, PCI-E, SATA, PATA, SCSI, ESDI and/or IDE.

The memory controller 410 may access the nonvolatile memory device 420 according to example embodiments of the inventive concepts described above with reference to FIGS. 1-11. When the error correction block 414 detects an uncorrectable error in read data, the memory controller 410 may vary a non-selection read voltage and may control the nonvolatile memory device 420 to perform two re-read operations (e.g., two re-read operations during a single data re-read for data correction). The memory controller 410 may detect and correct error due to a data retention characteristic on the basis of data output according to the two re-read operations. The memory controller 410 may selectively receive characteristics obtained from a manufacturer, a product number, process parameters, disturb, retention, the number of program/erase cycle (P/E cycle) and a pilot cell for more precisely estimating coupling and/or a retention characteristic.

Figure 13:
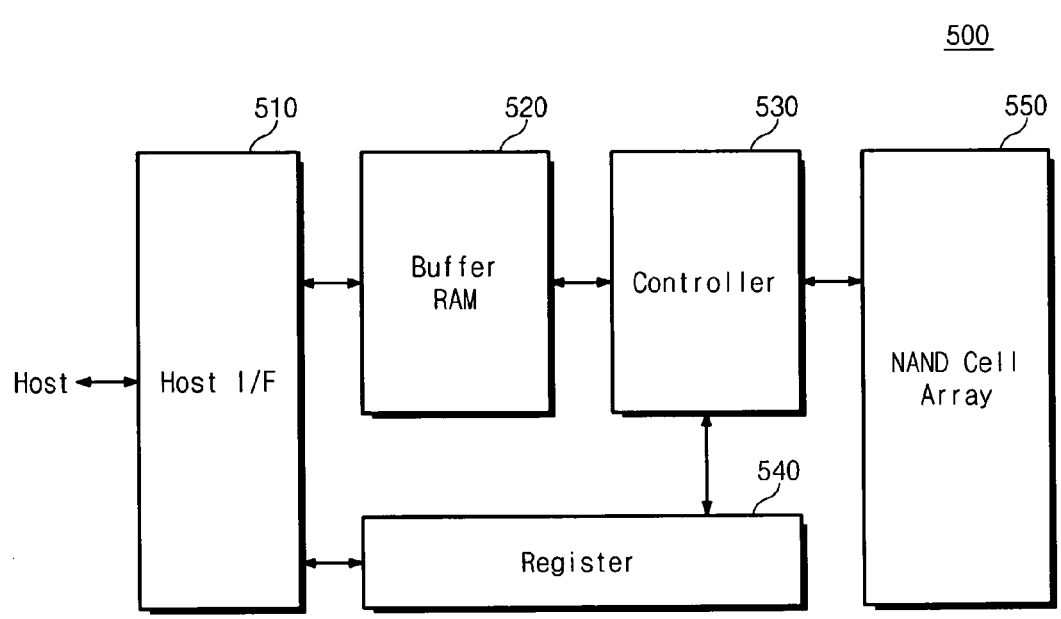

FIG. 13 is a block diagram illustrating fusion memory devices and/or fusion memory systems 500 performing program operations according to example embodiments of the inventive concepts (e.g., as described above with reference to FIGS. 1-11). For example, example embodiments may be applied to a OneNAND flash memory 500 as the fusion memory device. A OneNAND flash memory device 500 may include a host interface 510 exchanging different types of information with a device using different protocols, a buffer RAM 520 including an embedded code for the driving of a memory device and/or temporarily storing data, a controller 530 controlling read, program and other states in response to an external control signal and command, a register 540 storing data such as configuration defining system operation environments internal to the memory device, a command and an address, and a NAND flash cell array 550 including a nonvolatile memory cell and a page buffer. In response to a writing request from a host, the OneNAND flash memory device may write data into the NAND flash cell array 550 depending on program procedures according to example embodiments of the inventive concepts that may prevent the physical influence of attack cells.

Figure 14:
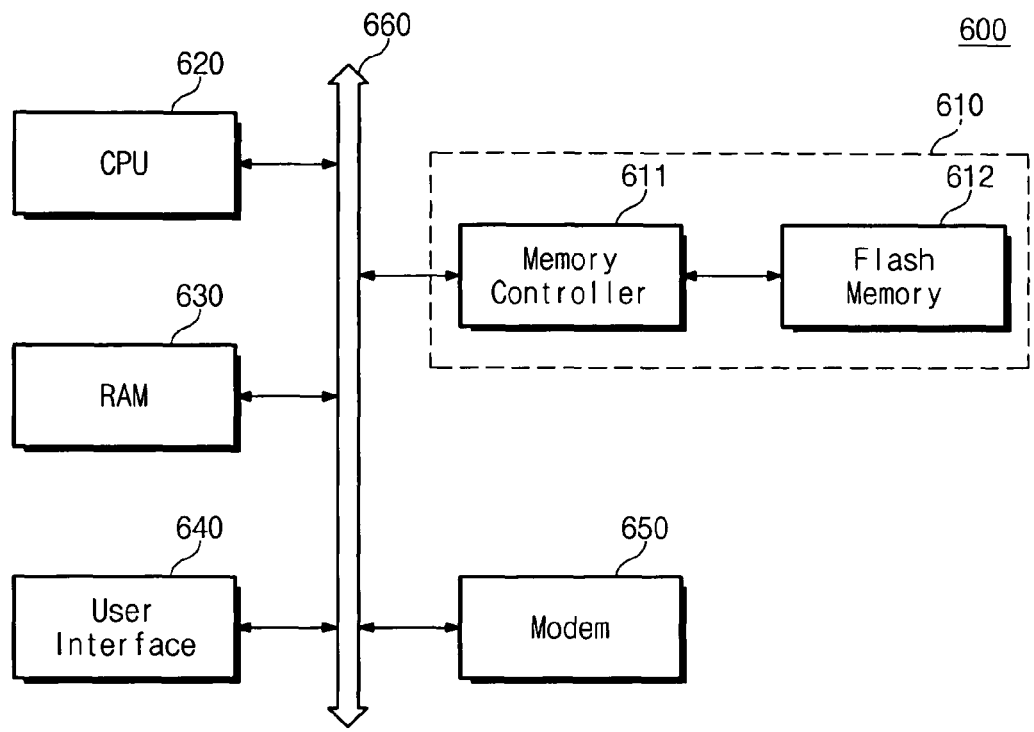

FIG. 14 is a block diagram illustrating computing systems 600 including flash memory devices 612 according to example embodiments of the inventive concepts. A computing system 600 according to example embodiments may include a microprocessor 620 electrically connected to a system bus 660, a RAM 630, a user interface 640, a modem 650 (e.g., a baseband chipset) and a memory system 610. The memory system 610 may be substantially the same as a memory system illustrated in FIGS. 12 and 13. In a case where the computing system 600 is a mobile device, a battery (not shown) may be additionally provided for applying the operation voltage of the computing system 600. Although not shown, it is obvious to those skilled in the art that the computing system 600 may further include, for example, an application chipset, a Camera Image Processor (CIS) and/or a mobile DRAM. The memory system 610, for example, may configure the SSD using a nonvolatile memory for storing data. A fusion flash memory (e.g., a OneNAND flash memory) may be provided as the memory system 610. The computing system 600 may receive a characteristic analysis of threshold voltage dispersion through the obtainment of index data and/or high-reliability data through dispersion separation according to a shift degree of the threshold voltage, for example, coupling from the memory system 610.

The semiconductor memory device according to example embodiments of the inventive concepts may be mounted using various types of packages. For example, the flash memory and/or memory controller may be mounted using a package such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP) and/or Wafer-Level Processed Stack Package (WSP).

Example embodiments of the inventive concepts may increase the reliability of highly-integrated multi-level cell nonvolatile memory devices and may extend the lifetime of the same. While example embodiments have been particularly shown and described, it will be understood by one of ordinary skill in the art that variations in form and detail may be made therein without departing from the spirit and scope of the claims.

What is claimed is:

1. A nonvolatile memory device error correction method, the error correction method comprising:
   applying a first non-selection read voltage to an unselected memory cell and reading first data from a selected memory cell;
   applying a second non-selection read voltage lower than the first non-selection read voltage to the unselected memory cell and reading second data from the selected memory cell; and
   detecting first read error in read data by comparing the first and second data.

2. The error correction method of claim 1, wherein the reading of the first and second data from the selected memory cell includes reading the first and second data according to a single level cell read mode.

3. The error correction method of claim 2, further comprising:
   applying a selection read voltage to the selected memory cell,
   wherein the selection read voltage is a ground voltage.

4. The error correction method of claim 1, wherein the detecting of the first read error in the read data includes detecting a logical value of the first data that is different from a logical value of the second data.

5. The error correction method of claim 4, further comprising:
   correcting the read data by inverting a bit of the read data corresponding to the detected first read error.

6. The error correction method of claim 5, further comprising:
   detecting and correcting, by an error correction code engine, a correctable data error in the corrected read data.

7. The error correction method of claim 5, further comprising:
   detecting uncorrectable error, by an error correction code engine, in the corrected read data;
   applying a third non-selection read voltage to the unselected memory cell and reading third data from the selected memory cell; and
   detecting second read error in the read data by comparing the first and third data.

8. The error correction method of claim 1, further comprising:
   detecting whether second read error in the read data is correctable by an error correction code engine.

9. The error correction method of claim 1, further comprising:
   reading third data from a monitoring cell; and
   determining the second non-selection read voltage based on the third data.

10. The error correction method of claim 9, wherein the nonvolatile memory device is a multi-bit nonvolatile memory device including memory cells having a plurality of program states, and
    the monitoring cell is programmed to one of the plurality of program states corresponding to a highest threshold voltage of the plurality of program states.

11. A semiconductor memory device, comprising:
    a nonvolatile memory configured to sense read data from a plurality of selected memory cells, the nonvolatile memory configured to sense first and second data from each of the plurality of selected memory cells, the first and second data corresponding to non-selection read voltage environments of different levels; and
    a memory controller configured to control the nonvolatile memory, the memory controller configured to compare the first and second data to detect read error and a read error location in the read data, the memory controller configured to correct the read error.

12. The semiconductor memory device of claim 11, wherein the first and second data are sensed according to a single level cell read mode.

13. The semiconductor memory device of claim 12, wherein the nonvolatile memory is configured to apply a first non-selection read voltage to a plurality of unselected memory cells to sense the first data, and apply a second non-selection read voltage that is a lower voltage than the first non-selection read voltage to the plurality of unselected memory cells to sense the second data.

14. The semiconductor memory device of claim 11, wherein the memory controller is configured to detect the read error and the read error location by identifying at least one bit location within the read data corresponding to at least one of the plurality of selected memory cells having the first data of a different logical value than the second data.

15. The semiconductor memory device of claim 14, wherein the memory controller is configured to invert a bit value corresponding to the at least one bit location to correct the read error at the read error location.

16. The semiconductor memory device of claim 11, wherein the memory controller includes an error correction code engine configured to detect and correct an error of at least one of the read data and the corrected read data.

17. The semiconductor memory device of claim 16, wherein the nonvolatile memory device is configured to sense third data from each of the plurality of selected memory cells,
    the nonvolatile memory is configured to apply first, second and third non-selection read voltages to each of a plurality of unselected memory cells to sense the first through third data, respectively,
    the error correction code engine is configured to detect uncorrectable error in the corrected read data, the uncorrectable error uncorrectable by the correction code engine, and
    the memory controller is configured to control the nonvolatile memory to apply the third non-selection read voltage to each of the plurality of unselected memory cells and sense the third read data upon detection of the uncorrectable error by the error correction code engine.

18. The semiconductor memory device of claim 11, wherein the nonvolatile memory includes a plurality of monitoring cells.

19. The semiconductor memory device of claim 18, wherein the nonvolatile memory is configured to sense third data from each of the plurality of monitoring cells, and
    the memory controller is configured to select the non-selection read voltage environment corresponding to the second data based on the third data.

20. The semiconductor memory device of claim 11, wherein the nonvolatile memory is configured to apply different non-selection read voltage environments corresponding to the second data based on locations of a plurality of unselected memory cells.

* * * * *